US006069580A

United States Patent [19]
Martinson

[11] Patent Number: 6,069,580
[45] Date of Patent: May 30, 2000

[54] MULTI-CONVERSION RADAR DETECTOR HAVING INCREASED TUNING RANGE AND SELF-CALIBRATING FUNCTION

[75] Inventor: Glen D. Martinson, Oakville, Canada

[73] Assignee: BEL-Tronics Company, Mississauga, Canada

[21] Appl. No.: 09/127,965

[22] Filed: Aug. 3, 1998

[51] Int. Cl.[7] .............................. G01S 7/40; H04B 17/00
[52] U.S. Cl. .......................... 342/20; 342/165; 342/173; 342/174; 342/195; 455/226.1; 455/228
[58] Field of Search .................................. 342/13, 20, 59, 342/175, 192, 193, 194, 195, 196, 197, 165, 173, 174; 455/334, 344, 345, 226.1, 226.2, 226.3, 226.4, 227, 228, 315

[56] References Cited

U.S. PATENT DOCUMENTS

| | | | |
|---|---|---|---|
| 5,268,689 | 12/1993 | Ono et al. | 342/20 |
| 5,389,930 | 2/1995 | Ono | 342/20 |

*Primary Examiner*—Bernarr E. Gregory
*Attorney, Agent, or Firm*—Donald E. Hewson

[57] ABSTRACT

The present invention provides a broad band, multi-band radar detector which may be configured so as to have two or three down conversion stages. There are three mixers in the circuit, the second of which has a frequency synthesized local oscillator which is governed by a phase lock loop feedback circuit under the control of a microprocessor, so that the output frequency of the second local oscillator may be varied by an amount equal to $\pm f_{adj}$. The first local oscillator is also under the control of the microprocessor, so that a specific intermediate frequency signal from the first mixer may be derived. By varying the frequency of the second frequency synthesized local oscillator, the tuning range of the radar detector may be increased in each frequency band of interest by an amount equal to $\pm f_{adj}$ for all frequency values in each respective frequency band of interest. The radar detector is a self-calibrating detector, so that the output frequency from the first swept local oscillator may be accurately controlled by determining the specific tuning voltage for a specific first local oscillator frequency at which a particular incoming radar signal may be detected. This is accomplished by bypassing the second mixer, and controlling its output frequency so that an harmonic frequency will mix with the first local oscillator frequency to give a calibration response for any predetermined input radar frequency. Accordingly, the problem of drift of the tuning capability of the radar detector may be accurately controlled.

21 Claims, 2 Drawing Sheets

MULTI-CONVERSION RADAR DETECTOR HAVING INCREASED TUNING RANGE AND SELF-CALIBRATING FUNCTION

FIELD OF THE INVENTION

This invention relates to broad band, multi-band radar detectors, particularly the kind of radar detector which is used to detect the presence of police radar. More particularly, the present invention is directed to broad band, multi-band radar detectors which are multi-conversion superheterodyne radar detectors which may be configured particularly so as to function as a dual conversion radar detector or as a triple conversion radar detector. The radar detector of the present invention may be configured so as to increase the tuning range in any frequency band of interest beyond that which is normally obtainable. Still further, radar detectors in keeping with the present invention may be configured so as to be self-calibrating, whereby a high degree of tuning accuracy in any desired radar frequency band may be assured, and whereby drifting of the tuning function of the radar detector over time and due to changes of temperature may be compensated for and overcome.

BACKGROUND OF THE INVENTION

Radar detectors for detecting police radar are well known. Many such radar detectors are sold by BEL-Tronics Company in association with its trade marks BEL®, VECTOR®, FMT®, FMT-FUNDAMENTAL MIXER TECHNOLOGY®, RSV®, SHADOW TECHNOLOGY®, among others; and a number of features of those radar detectors are such as those taught in U.S. Pat. Nos. 4,571,593, 4,952,936, and 4,961,074.

Presently, a new series of radar detectors is under development by BEL-Tronics Company, and they include image rejection mixers of the sort taught in co-pending U.S. patent application Ser. No. 09/097,261 filed Jun. 15, 1998.

Among the teachings of the co-pending application noted above, certain circuits are shown for the front end of broad band, multi-band radar detectors. The radar detectors of the present invention may utilize front ends such as those taught in the co-pending application; and the platform for such radar detectors as taught in the present application is therefore essentially the same as for radar detectors incorporating image rejection front ends as noted immediately above.

It is well known that any high frequency operating device, especially those which incorporate free running, wide band, voltage tuned oscillators, are subjected to inaccuracies due to drift, which may occur over time, or which may also occur as the ambient temperature in which the device is operating changes. If sufficient drifting occurs, then it is possible that the radar detector might not even be able to detect the presence of radar frequencies in one or more particular radar frequency bands of interest.

Radar detectors which utilize a swept frequency first local oscillator have the disadvantage that there may be poor frequency stability over time and temperature. Thus, in order that there is reasonable assurance that the radar detector will tune to any desired radar frequency band, the frequency of the swept first local oscillator should be controlled to a high degree. However, this is generally not possible; and therefore, a broader swept frequency band must be implemented. As a simple example to explain the importance of controlling the frequency of the swept first local oscillator, and for ease of understanding of the mathematics involved, a radar detector having a first local oscillator frequency of 10 GHz may be considered. The first local oscillator frequency of the postulated radar detector sweeps a radar band having a 100 MHz bandwidth. Obviously, the radar detector will not sweep any portion of the required bandwidth if the center frequency of the local oscillator changes by more than 1%—that is, if the local oscillator frequency changes by more than 100 MHz. Of course, in practise is it desirable to maintain the frequency of the swept first local oscillator to within ±0.1% of the nominal first local oscillator frequency, so as to prevent the oscillator frequency from drifting so far as to cause a loss of band coverage of any desired radar frequency band. To compensate for a possible drift of even 0.1%. it is therefore necessary to sweep the frequency of the first local oscillator an additional 10 MHz on either side of the band limit so as to ensure complete coverage of the desired radar frequency band at all times. However, it is virtually impossible to hold a swept local oscillator, particularly one operating in a multi-gigahertz frequency band such as about 10 GHz, or about 15 GHz in a more practical example, to maintain a tolerance of ±0.1% over time and when it may be exposed to a wide range of temperatures. This is, of course, particularly true in respect of a free running, wide band, voltage tuned local oscillator.

The present invention provides a means by which a high accuracy setting of the first local oscillator frequency may be established. This is discussed in greater detail hereafter. However, as will also be discussed hereafter, implementation of the high accuracy control of the first local oscillator frequencies comes as a consequence of incorporating into the platform of the radar detector a second local oscillator which is synthesized from a crystal reference so as to provide a high accuracy source of gigahertz frequency. Moreover, the second local oscillator, being a synthesized frequency local oscillator, has its frequency governed by a phase lock loop feedback circuit which, itself, is under the control of a microprocessor which is found in the radar detector. Thus, the output frequency of the synthesized frequency second local oscillator may be varied, and this gives rise to a radar detector wherein the tuning range in each frequency band of interest may be increased by an amount equal to the adjustment amount by which the frequency of the synthesized frequency second local oscillator may be adjusted. The adjustment amount must not exceed the first intermediate frequency bandwidth. This feature is discussed in greater detail hereafter.

On method for the calibration configuration scheme of the present invention to become operative is a feature of this invention. That is that the radar detector may change its configuration from a triple conversion radar detector to a dual conversion radar detector. In so doing, the second mixer is bypassed, by operation of a pair of single pole, double throw switches which are located one at each side of the second mixer, as described in greater detail hereafter.

In any radar detector, there may be mixing between the frequency components of the various local oscillators, particularly between the second local oscillator and the first local oscillator. This may often give rise to spurious responses which are undesirable because they may suggest that a radar signal in a particular band of interest may be present when, in fact, it is not. Various steps are taken to overcome the incidence of undesirable spurious responses, which steps are beyond the scope of the present invention. However, the inventor herein has determined a mechanism by which the spurious responses that occur may, in fact, be taken advantage of under controlled conditions. It is this fact which leads to the capability of radar detectors in keeping with the present invention to be self-calibrating at any instant in time, either under the control of the user or under self-control as determined by the microprocessor controller which is found in the radar detector. Thus, much greater accuracy of tuning, and control of drift due to passage of time or due to changes in ambient temperature, may be achieved in keeping with the present invention.

It is therefore an object of the present invention to provide a broad band, multi-band radar detector wherein the tuning range of the radar detector may be increased in each frequency band of interest by adjustment of the synthesized frequency second local oscillator which is found in the radar detector.

A further object of the invention is to provide such a radar detector as noted above, wherein one or another of three predetermined intermediate frequency signals may be obtained from the first mixer of the radar detector.

Yet another object of the present invention is to provide a broad band, multi-band radar detector which may be configured so as to function either as a triple conversion radar detector or as a dual conversion radar detector.

Still a further object of the present invention is to provide a radar detector which may function as a triple conversion radar detector or a dual conversion radar detector, which may be controlled so that, when the radar detector is functioning as a dual conversion detector, a third intermediate frequency may be output from the first mixer.

A still further purpose of the present invention is to provide a radar detector in which, by controlling the frequency of the synthesized frequency second local oscillator while the radar detector is functioning in a dual conversion mode, the radar detector may be calibrated so as to more accurately control the frequency of the swept frequency first local oscillator.

Yet a further object of the present invention is to provide a radar detector where either of the first or second local oscillators may be controlled, while the other second or first local oscillator is at a fixed frequency, so as to calibrate the radar detector to more accurately control the frequency of the swept frequency local oscillator.

A further object of the present invention is to provide methods by which a broad band, multi-band radar detector may be calibrated.

SUMMARY OF THE INVENTION:

In the first instance, the present invention provides a broad band, multi-band radar detector having at least two down conversion stages to down convert incoming high radio frequency radar signals in a plurality of frequency bands over a broad range of frequencies to lower frequency signals which indicate the presence of an incoming signal in any frequency band being tested for by the radar detector. The radar detector includes a receiving antenna, a microprocessor controller, a swept frequency first local oscillator, a synthesized frequency second local oscillator, a first mixer, and a second mixer.

The first mixer has a signal input port into which signals from the receiving antenna are applied, a local oscillator input port into which signals from the first local oscillator are applied, and an output port from which signals at a first intermediate frequency are derived.

The first local oscillator is under the control of the microprocessor, whereby the first intermediate frequency signal is derived at one of a first high intermediate frequency $f_h$ and a second low intermediate frequency $f_l$.

The second mixer has a signal input port into which signals at either of the first high intermediate frequency $f_h$ or the second low intermediate frequency $f^l$ are applied. It also includes a local oscillator input port into which signals from the second local oscillator are applied, and an output port from which signals at a second intermediate frequency are derived for further signal handling. Of course, in the event that the radar detector is a triple down conversion detector, the further signal handling will comprise the signal being passed to a third mixer.

The synthesized frequency second local oscillator is governed by a phase lock loop feedback circuit under the control of the microprocessor. Thus, the output frequency $f_{2lo}$ of the second local oscillator may be varied by an adjustment amount of plus or minus $f_{adj}$.

Accordingly, the tuning range of the radar detector may be increased in each frequency band of interest by an amount equal to $\pm f_{adj}$.

If a radar detector such as that described immediately above has a bandpass filter interposed between the second local oscillator and the local oscillator input port of the second mixer, then the bandpass filter will have a bandpass characteristic so as to pass frequencies at $f_{2lo} \pm f_{adj}$.

In a further embodiment of the present invention, a broad band, multi-band radar detector such as that described above has a pair of signal paths and a single pole, double throw switch which has a first switch position and a second switch position, interposed between the first mixer and the second mixer.

In that case, the first of the pair of parallel signal paths has a bandpass characteristic at a selected one or the other of the intermediate output frequencies $f_h$ and $f_l$ from the first mixer, so that a first intermediate frequency signal from the first mixer at the selected frequency $f_h$ or $f_l$ will be fed to the input port of the second mixer when the single pole, double throw switch is in its first switch position. The second of the pair of parallel signal paths has a bandstop characteristic at the same selected frequency as the bandpass characteristic of the first of the parallel signal paths. Thus, a signal at the other of the first intermediate frequency signals $f_h$ and $f_l$ will be fed past the bandstop filter to the input port of the second mixer when the single pole, double throw switch is in its second switch position.

In another aspect of the present invention, there is provided a broad band, multi-band radar detector which comprises a receiving antenna, a microprocessor controller, a first mixer, a swept frequency first local oscillator, a second mixer, a second local oscillator, a third mixer, a third local oscillator, signal processing circuits for processing signals input thereto from the third mixer, and output means for outputting visual and/or audio output signals in response to output signals from the signal processing means which indicate the reception by the receiving antenna of incoming radar signals in any frequency band of interest.

The first mixer has a signal input port into which signals from the receiving antenna are applied, a local oscillator input port into which signals from the first local oscillator are applied, and an output port from which signals at a first intermediate frequency are derived.

The first local oscillator is under the control of the microprocessor, so that the first intermediate frequency signal derived from the first mixer is at one of a first high intermediate frequency $f_h$ or a second low intermediate frequency $f_l$.

The second mixer has a signal input port into which signals at either of the first high intermediate frequency $f_h$ or the second low intermediate frequency $f_l$ are applied. It also includes a local oscillator input port into which signals from the second local oscillator are applied, and an output port from which signals at a second intermediate frequency are derived.

A first pair of parallel signal paths and a first single pole, double throw switch having a first switch position and a second switch position, are interposed between the first mixer and the second mixer.

The first of the first pair of parallel signal paths has a bandpass characteristic at a selected one or the other of the frequencies $f_h$ and $f_l$, so that a first intermediate frequency signal from the first mixer at that selected frequency will be fed to the input port of the second mixer when the first switch is in its first switch position. The second of the first pair of parallel signal paths has a bandstop characteristic at the same selected frequency $f_h$ or $f_l$, so that a signal at the other of the first intermediate frequency signal frequencies $f_h$ and $f_l$ will be fed to the input port of the second mixer when the first switch is in its second switch position.

The second intermediate frequency is fed to a signal input port of the third mixer, and signals at a preselected frequency are fed from the third local oscillator to a local oscillator port of the third mixer. Signals at a third intermediate frequency are derived from an output port of the third mixer, for further signal handling.

A second single pole, double throw switch which has a first switch position and a second switch position is interposed between the second mixer and the third mixer. There is also a second pair of parallel signal paths, which is interposed between the first switch and the second switch.

The first of the second pair of parallel signal paths is arranged so as to provide a straight signal path between the first switch and the second switch when the second switch is in its first position. Thus, the second mixer is bypassed.

The second of the second pair of parallel signal paths is arranged between the first switch and the second mixer, so as to provide a signal path through the second mixer when the second switch is in its second switch position.

Thus, when the first switch is in either of its first or second switch positions, and the second switch is in its second switch position, the radar detector functions as a triple conversion radar detector, having down conversion at each of the first, second, and third mixers.

However, when the first switch is in its second switch position and the second switch is in its first switch position, then the radar detector functions as a dual conversion radar detector, having down conversion at each of the first and third mixers.

In a radar detector such as that described immediately above, the second local oscillator frequency $f_{2lo}$ is higher than the frequency $f_l$ and is lower than the frequency $f_h$.

The second of the second pair of parallel signal paths, which is arranged between the first switch and the second mixer, comprises a pair of filters in series. The first of those filters is a bandpass filter which will pass frequencies over a band which includes all of the frequencies $f_l$, $f_{2lo}$, and $f_h$. The second filter is a bandstop filter at about the frequency $f_{2lo}$.

Thus, when the second switch is in its second position, either of the frequencies $f_l$ and $f_h$ will be applied to the input port of the second mixer, but the second local oscillator frequency $f_{2lo}$ will not be fed back towards the first mixer.

When the first switch is in its second position and the second switch is in its first position, in keeping with the present invention, the first local oscillator may be controlled by the microprocessor so that, in the presence of selected radar frequencies of interest, a third intermediate frequency may be output from the output port of the first mixer. The third intermediate frequency is set to be the same frequency as the intermediate frequency which would be output from the second mixer when the second switch is in its second position.

When the second local oscillator of a broad band, multi-band radar detector such as that described immediately above is a synthesized frequency local oscillator whose output is governed by a phase lock loop feedback circuit under the control of the microprocessor, then its output frequency $f_{2lo}$ may be varied by an amount of plus or minus $f_{cal}$. As with any oscillator where the oscillator element is non-linear, there will be harmonic signals at frequencies of $Nf_{2lo}$, where V is an integer. Those harmonic signals are present and may be radiated to and received at the signal input port of the first mixer.

For any desired input radar frequency, when present, there is a predetermined first intermediate frequency which is one of the frequencies $f_l$, $f_h$, and the third intermediate frequency referred to above. That predetermined first intermediate frequency is a function of a specific predetermined output frequency of the swept frequency first local oscillator when mixed with the desired input radar frequency.

The output frequency of the swept frequency first local oscillator is a function of the tuning voltage applied thereto. Moreover, the relationship between the output frequency of the first swept frequency local oscillator and the tuning voltage applied thereto may vary over time and/or with changes of temperature.

The microprocessor controller includes memory means to store data relating to a plurality of tuning voltage values for a plurality of respective predetermined output frequencies of the swept frequency first local oscillator. There are also provided updating means to update any of the stored data, under the control of the microprocessor.

A specific harmonic frequency $Nf_{2lo}$ of the output frequency of the synthesized frequency second local oscillator may be chosen from within the frequency range $N(f_{2lo} \pm f_{cal})$ by varying the output frequency of the synthesized frequency second local oscillator, so as to emulate reception of any desired input radar frequency when the correct respective specific predetermined output frequency of the swept frequency first local oscillator has been generated, in keeping with a calibration equation which is as follows:

$$Nf_{2lo} \pm f_{1lo} = f_{sif}$$

where $f_{1lo}$ is the correct specific predetermined output frequency, and $f_{sif}$ is the predetermined first intermediate frequency.

At any instant in time, the output frequency of the swept frequency first local oscillator may be swept under the control of the microprocessor until the frequency $f_{sif}$ is noted at the output port of the first mixer.

The radar detector comprises means for updating the tuning voltage value in the memory means at that instant in time for the correct specific predetermined output frequency of the swept frequency first local oscillator.

Thus, the radar detector may be easily calibrated to ensure that the presence of any desired input radar frequency will be detected by controlling the tuning voltage of the swept frequency first local oscillator.

One method of calibrating a broad band, multi-band radar detector as described immediately above comprises the steps of:

(a) Controlling the first switch to its second switch position, and controlling the second switch to its first switch position.

(b) Establishing a specified output frequency $f_{2lo}$ of the second synthesized frequency local oscillator, and establishing the integral value for N, so that the harmonic frequency $Nf_{2lo}$ will result in the output of intermediate frequency $f_{sif}$ from the first mixer when its local oscillator frequency $f_{1lo}$ reaches the specific predetermined output frequency for the desired input radar frequency.

(c) Sweeping the frequency output of the swept frequency first local oscillator until the first mixer output intermediate frequency $f_{sif}$ is noted. At that instant in time, the sweeping of the swept frequency first local oscillator is stopped.

(d) The value of the tuning voltage driving the swept frequency first local oscillator at that instant in time is noted.

(e) The respective tuning voltage value in the memory means is updated with the noted value.

Thus, until the radar detector is re-calibrated, it may be accurately set for determining the presence of the desired input radar frequency by setting the swept frequency first local oscillator to the correct frequency which is accomplished by establishing the respective tuning voltage therefor, in keeping with the value for that respective tuning voltage which is stored in the memory means.

Of course, a plurality of cycles of steps (a), (b), (c), (d), and (e) may be taken for a plurality of desired input radar frequencies, and a corresponding plurality of tuning voltage data for that plurality of desired input radar frequencies are stored in the memory means.

Thus, at any time, the radar detector may be re-calibrated for any selected plurality of the plurality of desired input radar frequencies.

Moreover, selected pairs of the plurality of desired input radar frequencies may be chosen, so as to establish the lower and upper limits, respectively, of any selected radar frequency band of interest.

BRIEF DESCRIPTION OF THE DRAWINGS

The novel features which are believed to be characteristic of the present invention, as to its structure, organization, use and method of operation, together with further objectives and advantages thereof, will be better understood from the following drawings in which a presently preferred embodiment of the invention will now be illustrated by way of example. It is expressly understood, however, that the drawings are for the purpose of illustration and description only and are not intended as a definition of the limits of the invention. Embodiments of this invention will now be described by way of example in association with the accompanying drawings in which.

DETAILED DESCRIPTION OF THE PREFERRED EMBODIMENTS

Figure 1:
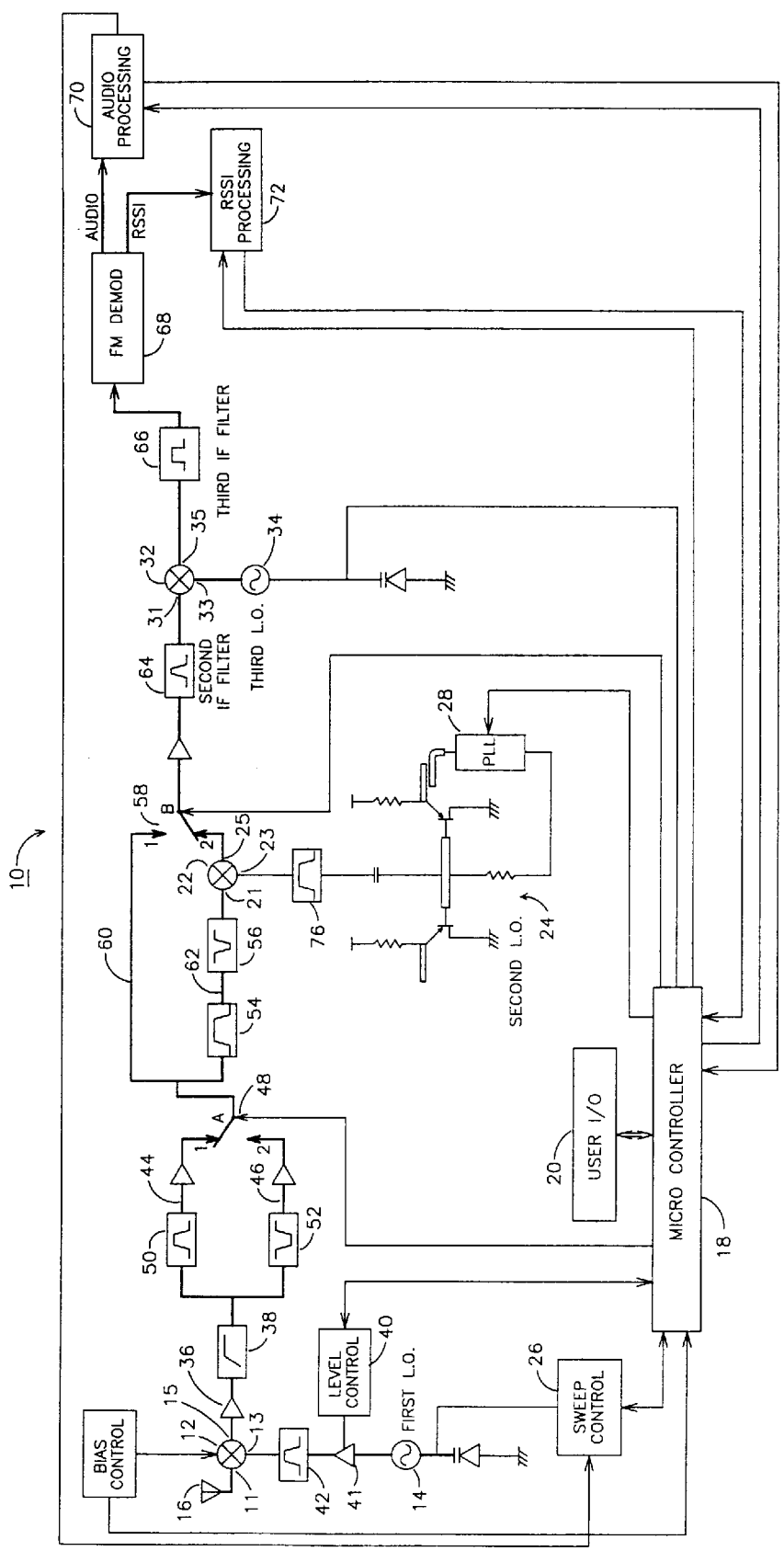
FIG. 1 is a general schematic of the circuit for a multi-conversion radar detector in keeping with the present invention.

It will be noted that, for purposes of the present discussion, the radar detector having a circuit as shown in FIG. 1 will be configured so as to have the intermediate frequency which is output from the first mixer to be at any one of three different first intermediate frequencies. They may be any selected frequencies; but for purposes of the present discussion, and noting that the radar detector being discussed herein will be functional at any police radar frequency band found in North America or Europe, specific intermediate frequencies are chosen as discussed hereafter. Moreover, the first intermediate frequencies are chosen because they are workable, they are economically viable in that the radar detector of the present invention may be constructed for the most part using "off-the-shelf" components, and the intermediate frequencies which are chosen will cover all of the desired frequencies for the different radar frequency bands within the constraints and the tuning range of a tunable first local oscillator.

The intermediate frequencies for the first mixer which are specifically chosen are 3.188 GHz, 5.0 GHz, and in certain operating configurations as described hereafter 0.906 GHz—or 906 MHz.

Moreover, the tuning frequency of the first local oscillator is set, in a particular embodiment of the present invention and so as to serve the purposes hereof in respect of any radar frequency band of interest, to have its frequency output swept over the range of approximately 14.5 GHz to 15.5 GHz.

Referring now to FIG. 1, there is shown a general circuit for a broad band, multi-band radar detector 10. Several of the principal components of the radar detector are the first mixer 12, the second mixer 22, and the third mixer 32, each having an associated local oscillator. They are: first local oscillator 14, second local oscillator 24, and third local oscillator 34. The radar detector has a receiving antenna 16; the physical configuration of which may generally be such as that taught by U.S. Pat. No. 4,571,593. noted above.

A microprocessor controller 18 is included in the radar detector 10; for purposes which are beyond the scope of the present invention, there is provided a user input/output interface 20, by which specific functions and the nature of specific outputs—both visual and audio—from the radar detector, may be controlled.

The first local oscillator 14 is, as noted, a voltage tuned swept frequency local oscillator, coming under the control of a sweep control circuit 26, which itself is controlled by the microprocessor controller 18.

Each mixer 12, 22, and 32, has a respective signal input port 11, 21, and 31, into which signals from a respective upstream signal source are applied. Each mixer includes a respective local oscillator input port 13, 23, and 33, into which signals from the respective local oscillators 14, 24, and 34, are applied. Finally, each mixer has a respective output port 15, 25, and 35, from which an intermediate frequency will be derived as a consequence of the signal mixing relationship of the input frequency and the local oscillator frequency, respectively, to each respective mixer.

It has been noted that the first local oscillator 14 is under the control of the microprocessor 18, and that control is such that the first intermediate frequency signal which is derived from the output port 15 of the first mixer 12 will—for purposes of the present discussion—be derived at one or the other of a first high intermediate frequency $f_h$ and a second low intermediate frequency $f_l$.

For the moment, it will be assumed that the first intermediate frequency signal at frequency $f_h$ or $f_l$ will be applied directly to the input port 21 of the second mixer 22, notwithstanding the presence of specific circuit elements interposed between the output of the first mixer 12 and the input of the second mixer 22, as discussed hereafter. Thus, it can be stated that the input to the signal input port 21 of the second mixer 22 may be, and will be in any event except as discussed hereafter, at either of the first high intermediate frequency $f_h$ or the second low intermediate frequency $f_l$. The intermediate frequency signal derived from the output port 25 of the second mixer 22 will, again for purposes of the present discussion, be considered to be delivered downstream to other circuit components of the radar detector, for further signal handling.

The second local oscillator 24 is a synthesized frequency local oscillator, which therefore provides a highly accurate and controllable output frequency due to the presence in the second local oscillator of a crystal oscillator reference. Moreover, the output frequency of the synthesized frequency second local oscillator 24 is governed by a phase lock loop feedback circuit 28, which itself is under the control of the microprocessor 18. Thus, the output frequency $f_{2lo}$ of the second local oscillator 24 may be varied by an adjustment amount of plus or minus $f_{adj}$.

The input frequency of the second local oscillator input may vary by an amount of $\pm f_{adj}$. It is evident that, in order to obtain the same output intermediate frequency from the output port 25 of the second mixer 22 with a varying input local oscillator signal frequency, the first intermediate frequency which is output from the output port 15 of the first mixer element 12 will vary by an amount equal to $\pm f_{adj}$. Thus, the tuning range of the radar detector in respect of the radar frequencies received by antenna 16 may be extended in each frequency band of interest by an amount equal to $\pm f_{adj}$ for all frequency values in each respective frequency band of interest received by the receiving antenna 16.

Typically, the output frequency of the synthesized frequency second local oscillator is 4.094 GHz. Moreover, typically the range over which the output frequency of the second local oscillator 24 may be varied, by control of the phase lock loop circuit 28, will be +100 MHz. Thus, the frequency of the synthesized frequency second local oscillator may be varied, under the control of the microprocessor 18 in association with the phase lock loop feedback circuit 28, between 3.994 GHz and 4.194 GHz. However, the bandwidth of the first intermediate frequency must be sufficient to accommodate this frequency variation.

Referring again to FIG. 1, it will be noted that the output intermediate frequency from output port 15 of the first mixer 12 may generally be fed first through a generally broad band amplifier 36, and a high pass filter 38, which will be discussed in greater detail hereafter. It is also noted that the local oscillator signal supplied to the mixer 12 from the first local oscillator 14 is controlled by a level control circuit 40 which adjusts the gain of the buffer amplifier 41 under the control of the microprocessor controller 18. The output of the first local oscillator 14 passes through a bandpass filter 42, which has a bandpass characteristic in the present circumstances of 14.5 GHz to 15.5 GHz. Thus, any signals except in that frequency band will not pass from the first local oscillator 14 to the first mixer 12.

Moreover, the tuning voltage of the first local oscillator 14, by which the specific output frequency within the band of frequencies swept by the local oscillator may be determined, is both under the control of and monitored by the sweep control circuit 26 in association with and under the control of the microprocessor controller 18. This is particularly discussed in greater detail, hereafter.

There is interposed between the output port 15 of the first mixer 12 and the input port 21 of the second mixer 22, a pair of parallel signal paths 44 and 46, and a single pole, double throw switch 48. The first signal path 44 has a bandpass characteristic at one or the other of the intermediate frequencies $f_h$ and $f_l$ which are output from the first mixer 12; and for purposes of this discussion, it is assumed that the first signal path 44 includes a bandpass filter 50 having a bandpass characteristic at 5.0 GHz. It will be seen that in order to process an intermediate frequency of 5.0 GHz from the first mixer 12, then the switch 48 must be in its first switch position indicated by the numeral 1 in the representation of that switch. Thus, an intermediate frequency signal of 5.0 GHz will pass towards to the second mixer 22.

For purposes of the present discussion, it is assumed that the second single pole, double throw switch 58 is configured so that the switch is in its second switch position, as shown by the numeral 2 in the representation of that second switch 58. In that configuration, a signal path exists between the output of the first switch 48 and the input port 21 of the second mixer 22.

The second parallel signal path 46 has a bandstop characteristic at the same select frequency as the bandpass characteristic of the first parallel signal path 44. Thus, the second parallel signal path 46 includes a bandstop filter 52; and for purposes of the present discussion, the bandstop characteristic of the filter 52 is also centered at 5.0 GHz.

Thus, if the radar detector 10 is intended to function such that it is seeking to determine the presence of an input radar signal at receiving antenna 16 whereby the output first intermediate frequency from the first mixer 12 will be 5.0 GHz, the first switch 48 is put into its first switch position under the control of the microprocessor controller 18. If, on the other hand, the radar detector 10 is to be configured such that the input radar frequency to be detected will result in an output first intermediate frequency of 3.188 GHz from the first mixer 12, the microprocessor controller 18 will place the switch 48 in its second switch position.

There also exists in the signal path between the output of the first switch 48 and the input port 21 of the mixer 22, when the second switch 58 is in its second switch position, a series arrangement of a bandpass filter 54 and a bandstop filter 56, the characteristics and purposes for which will be discussed hereafter. However, it will be noted that the characteristics are such that an intermediate frequency signal at either 3.188 GHz or 5.0 GHz will pass to the second mixer 22.

These features, as described above, ensure that in the configuration described, with the first switch 48 in either of its first or second switch positions. With the second switch 58 being placed in its second switch position, only intermediate frequencies at either of 3.188 GHz or 5.0 GHz, in the present circumstances, will pass from the first mixer 12 to the second mixer 22.

Beyond the second mixer 22 there is a third mixer 32, as noted, However, it will be noted that there is also a pair of parallel paths which are defined between the output of the first switch 48 and the second switch 58, depending on which of the first and second switch positions the second switch 58 is placed. Thus, it will be seen that when the second switch 58 is placed in its first switch position, no matter what the switch position of the first switch 48 will be, there will be a straight signal path 60 which will bypass the second mixer 22. The second of the second pair of parallel signal paths, path 62, comprises the series connection of the bandpass filter 54 and the bandstop filter 56.

There is interposed between the output of the second switch 58 and the input port 31 of the third mixer 32, a bandpass filter 64, which is set to have a bandpass characteristic at the output frequency of the second mixer 22. That frequency is 0.906 GHz, or 906 MHz.

Beyond the third mixer 32, there is a further bandpass filter 66 which has its characteristic at the output intermediate frequency from the third mixer 32. Its output is fed to an FM demodulator circuit 68, which has two outputs which are fed respectively to an audio processing circuit 70 and a processing circuit 72 which will provide information relating to the strength of the incoming radar signal (radar signal strength indicator circuitry).

Obviously, when the first switch 48 is in either of its first or second switch positions, and the second switch 58 is in its second switch position, the radar detector 10 functions as a triple conversion radar detector, having down conversion at each of the first, second, and third mixers 12, 22, and 32, respectively. However, when the first switch 48 is in its second switch position, and the second switch 58 is in its first switch position, it is obvious that the radar detector 10 functions as a dual conversion radar detector, having down conversion at each of the first and third mixers 12, 32, respectively.

Referring to the second parallel signal path 62 of the second pair of parallel signal paths 60, 62, it will be noted that the bandpass characteristic of the filter 54 is such that it will pass any signal between 2.9 GHz and 5.0 GHz. Also, the bandstop characteristic of the filter 56 is centered at 4.1 GHz.

It has been noted above that the nominal output frequency from the synthesized frequency second local oscillator 24 is generally 4.094 GHz. A bandpass filter 76 is interposed between the output of the second local oscillator and the local oscillator input port 23 of mixer 22. The bandpass characteristic of filter 76 is such that it will pass frequencies in the range of at least 3.994 GHz up to 4.194 GHz—so as to accommodate the frequency adjustment of $\pm f_{adj}$, as discussed above—without any appreciable loss. The bandstop characteristic of the filter 56 is such that signals in that same frequency range will be significantly attenuated before reaching the bandpass filter 54, and further upstream to the first switch 48 and beyond. Thus, feedback of the second local oscillator frequency towards the first mixer 12 is precluded. Of course, it is noted that the output frequency 4.094 GHz from the second local oscillator 24 is between the low and high first intermediate frequencies 3.188 GHz and 5.0 GHz, respectively, which may be derived from the first mixer 12.

Moreover, when the first switch 48 is in its second position, whereby signals at about 5.0 GHz will be stopped but signals above or below 5.0 GHz will pass the bandpass filter 52, and the second switch 58 is in its first position so that the straight signal path 60 is operative, then it is possible also to control the first local oscillator 14 from the microprocessor controller 18 so that, in the presence of other selected radar frequencies of interest, a third intermediate frequency may be output from the output port 15 of the first mixer 12. That third intermediate frequency will be the same as the intermediate frequency which would be output from the second mixer 22 if the second switch 58 were in its second switch position, namely 906 MHz.

Thus, the radar detector 10 may also be configured so as to have three specified intermediate frequency output frequencies from the first mixer 12, when it is configured as a dual conversion radar detector. Accordingly, the high pass filter 38 must be such that it will pass any of the intended intermediate frequencies from the first mixer 12. Typically, it is configured to have a high pass characteristic at about 900 MHz.

It has been stated above that harmonics of the second local oscillator 24 may be radiated to the first mixer 12. As discussed above, this may give rise to spurious responses, which falsely indicate the presence of a radar frequency of interest at receiving antenna 16 when none, in fact, exists. However, by judicious choice of local oscillator frequencies, intermediate frequencies, and signal handling and processing criteria, all of which are beyond the scope of the present invention, the problem with spurious responses is generally overcome.

However, as noted, the inventor herein has determined that advantage can be taken of certain spurious responses, which hereafter will be referred to as calibration responses, whereby the output frequency from the first swept local oscillator 14 may be accurately controlled by determining the specific tuning voltage for a specific first local oscillator frequency at which a particular incoming radar signal may be detected, giving one or the other of the specific intermediate frequencies from the first mixer 12. Accordingly, the problem of drift of the tuning capability of the radar detector, particularly because of the drift of the free running, wide band, voltage tuned oscillator which is the swept frequency first local oscillator 14, may be accurately controlled. This is accomplished by calibration of the first local oscillator by determining the tuning voltage for any specific output frequency thereof. Accordingly, short and long term drift problems, due to the passage of time or changes in ambient temperature, may be overcome.

It has been noted above that harmonics of the second local oscillator will mix with the first local oscillator. At certain first local oscillator frequencies, the mix product of the harmonic frequency of the second local oscillator and the first local oscillator frequency may fall within either of the first intermediate frequencies 3.188 GHz or 5.0 GHz. However, such spurious responses, if they occur, do not normally fall within any desired input radar frequency band of interest.

On the other hand, if a spurious response happens to fall into one of the first intermediate frequencies 3.188 GHz, 5.0 GHz, or 906 MHz, for an input radar frequency band of interest, the respective first intermediate frequency may be slightly shifted by changing the output frequency of the second local oscillator. This has the effect of shifting the harmonics of the second local oscillator, and thereby any spurious response for the specific input radar frequency band of interest will also be shifted outside that band of interest.

It has also been noted that the radar detector 10 of the present invention may be configured so that the first mixer 12 may have an output first intermediate frequency of 906 MHz. When the first switch 48 is in its second switch position, and the second switch 58 is in its first switch position, a 906 MHz intermediate frequency will be fed from the output port 15 of first mixer 12 through the high pass filter 38, through the bandstop filter 52, and through the bandpass filter 64, to the input port 31 of the third mixer 32. In this configuration, the radar detector is functioning as a dual conversion radar detector having a first intermediate frequency from the first mixer of 906 MHz.

Thus, in the configuration described immediately above, the synthesized frequency second local oscillator 24 is not required for signal down conversion, and its output frequency $f_{2lo}$ may be set to any desired frequency. In general, that other desired frequency will vary from $f_{2lo}$ by an amount of $\pm f_{cal}$; and in general, that frequency band may vary from 3.85 GHz up to 4.25 GHz.

However, harmonic signals of frequencies $Nf_{2lo}$, where N is an integer, those signals will be present within the radar detector 10 and may be radiated to and received at the signal input port of the first mixer 12.

For any desired input radar frequency there will be a predetermined first intermediate frequency when there is a specific predetermined output frequency of the swept frequency first local oscillator 14. For example, consider the case where there is an input frequency of 16.1 GHz. In order to obtain an intermediate frequency of 906 MHz, the specific local oscillator frequency must be 16.1±0.906. Since the first local oscillator is arranged to have a frequency range of only between 14.5 GHz and 15.5 GHz, then the specific first oscillator frequency to detect an incoming radar signal at 16.1 GHz with a 906 MHz intermediate frequency output from the first mixer, will be 15.194 GHz (16.1−0.906= 15.194).

Now, consider that it is necessary to determine what tuning voltage for the swept frequency first local oscillator 14 is required to give an output frequency of 15.194 GHz. Over time, and dependent upon temperature conditions, that tuning voltage may change.

However, in keeping with the present invention, it is possible to calibrate the radar detector to determine precisely what tuning voltage will be required to obtain a first local oscillator frequency of 15.194 GHz.

Specifically, a calibration equation will establish the frequency of the second local oscillator which will provide a harmonic frequency which when mixed with the first oscillator frequency, will give the specific intermediate frequency which is required. That equation is:

$$|Nf_{2lo} \pm f_{1lo}| = f_{sif}$$

where $f_{1lo}$ is the correct specific predetermined output frequency for the first local oscillator, and $f_{sif}$ is the predetermined first intermediate frequency. The above equation may also be written as follows:

$$Nf_{2lo} = |f_{sif} \pm f_{1lo}|$$

or $$f_{2lo} = \frac{|f_{sif} \pm f_{1lo}|}{N}$$

Now, testing for a specific first local oscillator frequency of 15.194, if the frequency of the second synthesized frequency local oscillator is set to 4.025, then the fourth harmonic of that frequency is 16.1 GHz, and if the first oscillator frequency 15.194 is subtracted from that frequency, an intermediate frequency of 0.906 GHz results. Therefore, settings the second oscillator frequency to 4.025 and sweeping the first oscillator until an intermediate frequency of 0.906 is obtained, will indicate a calibration response—i.e., when the first local oscillator output frequency is 15.194.

At that instant in time, the sweep control circuit 26 can note the specific tuning voltage value required, and that value can be updated in the respective memory location in the memory means located in the microprocessor controller 18.

Thereafter, when it is specifically required that there shall be an output frequency of 15.194 from the first local oscillator, the microprocessor controller will control the sweep control circuit to obtain the appropriate and predetermined tuning voltage.

In general, the second local oscillator 24 is a push—push frequency doubler type of oscillator. That means that the output frequency $f_{2lo}$ is, in fact, twice the fundamental frequency $f_{2lof}$ of the oscillator within the synthesized frequency local oscillator. Accordingly, the calibration equations becomes:

$$\frac{|Nf_{2lo} \pm f_{1lo}|}{|2|} = f_{sif}$$

which may also be written as $|Nf_{2lof} \pm f_{1lo}| = f_{sif}$

Another example of finding the tuning voltage required to set the first local oscillator to a specific frequency now follows. In this case, because the second local oscillator is a push—push frequency doubler oscillator, there may be closer control and an easier determination for the requisite tuning voltage. For example, if it is determined that the output frequency of the first local oscillator should be 15.246 GHz, and once again the specific intermediate frequency is 906 MHz then the calibration equation may specifically be:

$$f_{1lo} - \frac{Nf_{2lo}}{2} = 0.906$$

That equation becomes:

$$f_{2lo} = \frac{(f_{1lo} - 0.906)2}{N}$$

which for a first local oscillator frequency of 15.246 GHz becomes:

$$f_{2lo} = \frac{(15.246 - 0.906)2}{N}$$

For N=7, the frequency of the second local oscillator becomes 4.097 GHz.

Thus, the frequency of the second local oscillator 24 will be set to 4.097 GHz, by controlling the phase lock loop circuit 28 from the microprocessor controller 18. Then, the frequency of the voltage tuned swept frequency first local oscillator 14 will be swept until a calibration response is noted—i.e., an intermediate frequency signal at 906 MHz from the first mixer is noted. Once again, the specific tuning voltage value will be registered in a respective memory location in the microprocessor controller, for subsequent reference and re-calibration of the radar detector.

The harmonics of a fundamental oscillator that tunes between $f_{max}$ and $f_{2min}$ will provide continuous frequency coverage beginning at $Nf_{2min}$, if $Nf_{max}=(N+1)f_{2min}$, wherein N is the harmonic number. For example an oscillator that tunes from 1.792 GHz to 2.048 GHz will generate harmonics that give continuous frequency coverage beginning with the seventh harmonic of $f_{2min}$ at 12.544 GHz. The fundamental frequencies specified are from the push—push frequency doubling oscillator, therefore its output frequency must be tunable over the range 3.584 GHz to 4.096 GHz a total span of 512 MHz.

| Harmonic Number | 7 | 8 | 9 |
|---|---|---|---|
| $f_{2max}$ 2.048 GHz | 14.336 | 16.384 | 18.432 |
| $f_{2min}$ 1.792 GHz | 12.544 | 14.336 | 16.128 |

In the dual conversion mode of operation, any signal that is offset from the first local oscillator by ±906 MHz (i.e., higher or lower) will generate a receiver response. If the receiver first local oscillator tunes between 14.5 GHz and 15.5 GHz, then a receiver response can be generated at any local oscillator frequency within this range if a signal source having a frequency span of 13.594 to 14.594 GHz or 15.406 to 16.406 GHz is available. Harmonics of the synthesized oscillator can be set anywhere within the previously specified ranges, and can therefore generate a receiver response at any predetermined local oscillator frequency.

Figure 2:
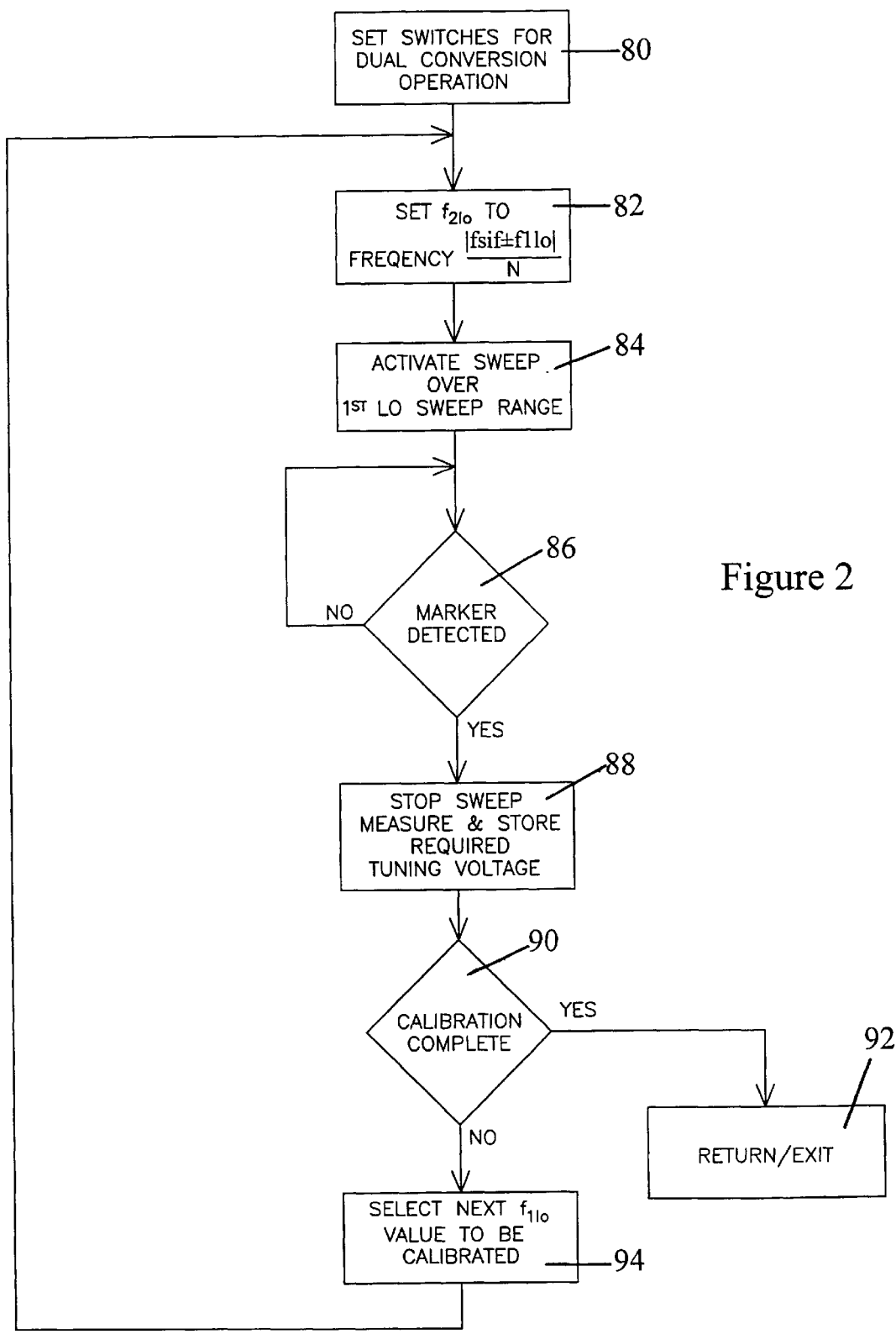
FIG. 2 is a flow chart showing a method of calibrating a multi-conversion radar detector for any desired input radar frequency.

All of the above steps may be summarized in the following manner, having regard to FIG. 2:

The present invention provides a method of calibrating the broad band, multi-band, radar detector of the present invention, for any desired input radar frequency, and broadly speaking the steps for so doing are:

(a) First, the first switch is set to its second switch position, and the second switch is set to its first position, as shown in FIG. 2 at step 80.

(b) The specific output frequency $f_{2lo}$ of the second synthesized frequency local oscillator is established, and the integral value for N is also established. As noted above, the harmonic frequency $Nf_2lo$ will then result in the output of the intermediate frequency $f_{sif}$ from the first mixer, when the output frequency $f_1lo$ reaches the specific predetermined output frequency for the desired input radar frequency. All of this is indicated at step 82, particularly the setting of the frequency $f_2lo$.

(c) The frequency output of the swept frequency first local oscillator is swept until the first mixer output intermediate frequency $f_{sif}$ is noted, as shown at steps 84 and 86. Then, the sweeping of the swept frequency local oscillator is stopped at that instant in time, as shown at step 88.

(d) The value of the tuning voltage driving the swept frequency first local oscillator at that instant in time is noted, also as seen in step 88.

(e) The respective tuning voltage in the memory location in the memory means located in the microprocessor controller 18 is then updated, also as a consequence of the step 88.

A decision is then made at step 90 as to whether the calibration is complete, if it is, step 92 is invoked, otherwise, step 94 is invoked. In any event, until the radar detector is re-calibrated, it is accurately set for determining the presence of the desired input radar frequency by setting the swept frequency first local oscillator to the correct frequency by establishing the respective tuning voltage therefor in keeping with the value thereof stored in the memory means.

It will be clear that the method of calibration, as specified above, is such that the radar detector may be calibrated for any frequency of interest. Indeed, a plurality of cycles of the steps of the method, as described above, can be taken for a plurality of desired input radar frequencies, and a corresponding plurality of tuning voltage data for that plurality of desired input radar frequencies will then be stored in the memory means. Thus, at any time, the radar detector may be re-calibrated for any selected plurality of the plurality of the desired input radar frequencies.

That means, particularly, that when a selected pair of the plurality of desired input radar frequencies is chosen that pair of frequencies may establish the lower and upper limits of any selected radar frequency band of interest. Therefore, a plurality of desired radar frequency bands of interest may be calibrated for.

The decision to calibrate or re-calibrate the radar detector may be made at any time while the radar detector is operating. The calibration step may be initiated from the user input/output interface 20; or more particularly, the calibration step may be performed periodically under the control of the microprocessor controller 18. Since any calibration step takes, at best, several hundred milliseconds, the radar detector may be continuously re-calibrated as often as every five or ten minutes.

A more general discussion of the principals underlying the self-calibration aspects of the present invention now follows.

First, it should be noted that either the first local oscillator 14 or the second local oscillator 24 might, in certain circumstances, be a swept frequency local oscillator, with the other oscillator being a controllable fixed frequency local oscillator. Moreover, any swept frequency local oscillator might be utilized. Apart from conventional oscillators of the sort usually found in radar detectors, another voltage controlled push—push oscillator is that which is taught in U.S. Pat. No. 5,402,087 issued Mar. 28, 1995 to GORCZAK.

In any local oscillator, spurious responses, as discussed above, will usually arise when the frequency components of one local oscillator mix with frequency components of a second local oscillator, in such a manner that a mix product of those two local oscillator frequency components will fall within an intermediate frequency or input frequency of the radar detector circuit. In other words, the mix product may fall within an intermediate frequency or an input frequency of either one or the other of the mixers associated with the two local oscillators discussed immediately above. Of course, it is also understood that the intermediate frequencies of the respective mixers, or the input frequencies to the respective mixers, are those frequencies which are established by the respective local oscillator frequencies of the local oscillators.

Any particular spurious response might well be due to a mix of two local oscillator frequency components; but the exact method by which the mixing takes place may come as a consequence of one or another of a variety of different mechanisms. In fact, such a spurious response might be due to the mixing of the oscillator frequency components within several different elements of the radar detector. In that case, the resultant magnitude of the spurious response is determined by the magnitude of the individual responses in the respective different elements of the radar detector, their relative phases, and even the process by which they are combined.

However, more generally, even if a local oscillator has high spectral purity so that its input frequency to its respective mixer may be at a single frequency—specifically, the output frequency might have a high quality sinusoidal waveform—because the mixer is a non-linear device, mix products might well be produced by the mixer which result from harmonic components of the local oscillator frequency that were generated in the mixer itself.

Moreover, as noted, it might well be that the fundamental or harmonics of one local oscillator frequency might mix with the fundamental or harmonics of the other local oscillator frequency, and the same result might occur no matter if it is an harmonic of the first local oscillator mixing with the second local oscillator, or vice versa.

As an example, a dual conversion radar detector might be considered, where the dual conversion radar detector has a swept frequency first local oscillator—for example, local oscillator 14—which sweeps between 11.0 GHz and 12.0 GHz. The first intermediate frequency from the first mixer is set to be 1.0 GHz. The second local oscillator—for example, local oscillator 24—is a fixed frequency local oscillator which is set at 0.99 GHz. Thus, the second intermediate frequency is 10 MHz (0.01 GHz).

Consider the case where a spurious response can arise when the first local oscillator is tuned to 11.89 GHz. This spurious response can be generated in at least two different ways:

The first mechanism by which the spurious response can occur is when the eleventh harmonic of the second local oscillator, namely 10.89 GHz, radiates into the first mixer where it mixes with the first local oscillator signal at 11.89 GHz, so as to generate a 1.0 GHz intermediate frequency output from the first mixer. That spurious signal would then be processed throughout the remaining radar detector signal processing circuitry, even though there was no real signal present at the input antenna 16.

An alternative scenario arises when the first local oscillator frequency 11.89 GHz leaks into the second mixer, where it will mix with the twelfth harmonic of the second local oscillator frequency, which is 11.88 GHz. Thus, an intermediate frequency component at 10 MHz will be generated, which of course is the predetermined second intermediate frequency in the present discussion. Once again, the signal handling circuits of the radar detector will assume that an incoming radar signal is present at antenna 16, when none in fact exists.

Still further, both mechanisms might, in fact, occur.

As noted above, it is usual that appropriate steps are taken by any radar detector designer to mitigate the generation of such spurious responses, as discussed immediately above. However, it has also been noted above that the present inventor has determined that such spurious responses can be taken advantage of, whereby a calibration response can be obtained with a precisely tuned local oscillator functioning together with a swept frequency local oscillator, in the manner described above. A low cost, broad band, multi-band radar detector or other microwave scanning receiver is therefore achievable.

Accordingly, the present invention therefore further contemplates a self-calibrating broad band, multi-band radar detector which, having regard to the configuration of FIG. 1, will comprise at least a first mixer circuit and a second mixer circuit. The first mixer circuit includes a first mixer element 12 having a signal input port 11, a local oscillator input port 13, and an intermediate frequency output port 15. The first mixer circuit also includes a first local oscillator 14, whose output frequency $f_{1lof}$ is controllable.

Likewise, the second mixer circuit includes a second mixer element 22 having a signal input port 21, a local oscillator input port 23, and an intermediate frequency output port 25. The second local oscillator 24 is an oscillator whose output frequency $f_{1lof}$ is controllable.

For purposes of the present discussion, however, either one of the first or second local oscillators can be considered to be a voltage tuned, swept frequency local oscillator, as described above. In that case, the other of the first and second local oscillators is a synthesized frequency local oscillator whose output frequency is governed by a controllable phase lock loop feedback circuit, also as described above.

The fundamental frequency or an harmonic thereof of either of the first and second mixer circuits—each including the respective local oscillator and mixer element—may mix with the fundamental frequency or an harmonic thereof of the other of the second and first mixer circuits. There will thus be an intermediate frequency output from the other of the second or first mixer circuits.

For any predetermined input radar signal frequency which may be input to the input port of the first mixer element, there will be a specific intermediate frequency output signal from the output port of the first mixer element 12 when the first local oscillator frequency $f_{1lof}$ has a predetermined value. Likewise, for any predetermined input signal frequency which may be input to the second mixer—and which is generally the intermediate frequency signal output from the first mixer—there will be a specific intermediate frequency output from the output port of the second mixer element when the second local oscillator frequency $f_{2lof}$ has a predetermined value.

Accordingly, any predetermined radar input signal frequency which has a specific intermediate frequency $f_{sif}$ which is output from either of the first mixer or second mixer will have a calibration equation, as follows:

$|Nf_{1lof} \pm Mf_{2lof}|=f_{sif}$ where N and M are integers of 1 or greater.

Of course, it has been noted above that the microprocessor controller 18 will include means for establishing the integral values of N and M. It will also include appropriate means for controlling the phase lock loop feedback circuit of the synthesized frequency local oscillator to set the output frequency thereof to the respective output frequency $f_{2lof}$ or $f_{1lof}$. The microprocessor controller 18 also includes appropriate means for sweeping the output frequency of the swept frequency local oscillator by adjusting the tuning voltage thereof, until such time as a specified intermediate frequency signal at the frequency $f_{sif}$ is noted at the output port of the respective first or second mixer element. At that time, the respective output frequency $f_{1lof}$ or $f_{2lof}$—whichever is the output frequency of the swept frequency local oscillator—will have been reached, which satisfies the calibration equation noted above. Accordingly, the tuning voltage for that respective input radar frequency will be noted in the respective memory means within the microprocessor controller 18. Thus, the respective tuning voltage values which set any respective output frequency of the swept frequency local oscillator for a respective input radar frequency may be stored in the memory means for later recall. Thus, as before, the tuning voltage of the swept frequency local oscillator may be re-set to any respective value for any respective input radar frequency to the radar detector.

Of course, it is recognized that there may be other mechanisms by which spurious responses may occur; but so long as there is a measurable response which may be noted at the output of any mixer—usually the first and second mixers as discussed herein—the principles of the present invention may be applied so as to calibrate the swept frequency local oscillator.

There has been described a broad band, multi-band radar detector having a number of features, the principals and scope of which are defined in the appended claims.

What is claimed is:

1. A broad band, multi-band radar detector having at least two down conversion stages to down convert incoming high radio frequency radar signals in a plurality of frequency bands over a broad range of frequencies to lower frequency signals which indicate the presence of an incoming signal in any frequency band being tested for by said radar detector, wherein said radar detector includes a receiving antenna, a microprocessor controller, a swept frequency first local oscillator, a synthesized frequency second local oscillator, a first mixer, and a second mixer:

said first mixer having a signal input port into which signals from said receiving antenna are applied, a local oscillator input port into which signals from said first local oscillator are applied, and an output port from which signals at a first intermediate frequency are derived;

said first local oscillator being under the control of said microprocessor;

said second mixer having a signal input port into which signals at said first intermediate frequency are applied, a local oscillator input port into which signals from said second local oscillator are applied, and an output port from which signals at a second intermediate frequency are derived for further signal handling;

wherein said synthesized frequency second local oscillator is governed by a phase lock loop feedback circuit under the control of said microprocessor, and the output frequency $f_{2lo}$ of said second local oscillator is varied under the control of said microprocessor by an adjustment amount of plus or minus $f_{adj}$;

whereby the tuning range of said radar detector is increased in each frequency band of interest by an amount equal to $\pm f_{adj}$.

2. The broad band, multi-band radar detector of claim 1, in which a bandpass filter having a characteristic to pass frequencies at $f_{2lo} \pm f_{adj}$ is interposed between said second local oscillator and said local oscillator input port of said second mixer.

3. The broad band, multi-band radar detector of claim 1, in which the frequency of said second local oscillator is adjusted to shift any spurious response for an input radar frequency band of interest which falls within any input radar frequency band of interest out of that input radar frequency band of interest.

4. A broad band, multi-band radar detector having at least two down conversion stages to down convert incoming high radio frequency radar signals in a plurality of frequency bands over a broad range of frequencies to lower frequency signals which indicate the presence of an incoming signal in any frequency band being tested for by said radar detector, wherein said radar detector includes a receiving antenna, a microprocessor controller, a swept frequency first local oscillator, a synthesized frequency second local oscillator, a first mixer, and a second mixer:

said first mixer having a signal input port into which signals from said receiving antenna are applied, a local oscillator input port into which signals from said first local oscillator are applied, and an output port from which signals at a first intermediate frequency are derived, said first local oscillator being under the control of said microprocessor, whereby said first intermediate frequency signal is derived at one of a first high intermediate frequency $f_h$ and a second low intermediate frequency $f_l$;

said second mixer having a signal input port into which signals at said first intermediate frequency are applied, a local oscillator input port into which signals from said second local oscillator are applied, and an output port from which signals at a second intermediate frequency are derived for further signal handling; and a pair of parallel signal paths in series with a first single pole, double throw switch means being interposed between said first mixer and said second mixer, said first single pole, double throw switch means having a first switch position and a second switch position;

wherein the first of said pair of parallel signal paths has a bandpass characteristic at a selected frequency chosen from a group of frequencies consisting of said first intermediate frequencies $f_h$ and $f_l$, whereby said first intermediate frequency signal from said first mixer at said selected frequency will be fed to the input port of said second mixer when said first switch is in said first switch position;

wherein the second of said pair of parallel signal paths has a bandstop characteristic at the same selected frequency, whereby a signal at the other of said first intermediate frequency signal frequencies $f_h$ and $f_l$ will be fed to the input port of said second mixer when said first switch is in said second switch position; and wherein said synthesized frequency second local oscillator is governed by a phase lock loop feedback circuit under the control of said microprocessor, and the output frequency $f_{2lo}$ of said second local oscillator is varied under the control of said microprocessor by an adjustment amount of plus or minus $f_{adj}$;

whereby the tuning range of said radar detector is increased in each frequency band of interest by an amount equal to $\pm f_{adj}$.

5. The broad band, multi-band radar detector of claim 4, in which a bandpass filter having a characteristic to pass frequencies at $f_{2lo} \pm f_{adj}$ is interposed between said second local oscillator and said local oscillator input port of said second mixer.

6. A broad band, multi-band radar detector comprising a receiving antenna, a microprocessor controller, a first mixer, a swept frequency first local oscillator, a second mixer, a second local oscillator, a third mixer, a third local oscillator, signal processing circuits for processing signals input thereto from said third mixer, and output means for outputting signals chosen from the group consisting of visual output signals, audio output signals, and combinations thereof, in response to output signals from said signal processing means which indicate the reception by said receiving antenna of incoming radar signals in any frequency band of interest;

said first mixer having a signal input port into which signals from said receiving antenna are applied, a local oscillator input port into which signals from said first local oscillator are applied, and an output port from which signals at a first intermediate frequency are derived;

said first local oscillator being under the control of said microprocessor, whereby said first intermediate frequency signal is derived at one of a first high intermediate frequency $f_h$ and a second low intermediate frequency $f_l$;

said second mixer having a signal input port into which signals at said first intermediate frequency are applied, a local oscillator input port into which signals from said second local oscillator are applied, and an output port from which signals at a second intermediate frequency are derived;

a first pair of parallel signal paths in series with a first single pole, double throw switch means being interposed between said first mixer and said second mixer, said first single pole, double throw switch means having a first switch position and a second switch position;

wherein the first of said first pair of parallel signal paths has a bandpass characteristic at a selected frequency chosen from the group of frequencies consisting of said first intermediate frequencies $f_h$ and $f_l$, whereby said first intermediate frequency signal from said first mixer at said selected frequency will be fed to the input port of said second mixer when said first switch is in said first switch position; wherein the second of said first pair of parallel signal paths has a bandstop characteristic at the same selected frequency, whereby a signal at the other of said first intermediate frequency signal frequencies $f_h$ and $f_l$ will be fed to the input port of said second mixer when said first switch is in said second switch position;

said third mixer having a signal input port into which signals at said second intermediate frequency are applied, a local oscillator port into which signals at a preselected frequency from said third local oscillator are applied, and an output port from which signals at a third intermediate frequency are derived for further signal handling;

a second single pole, double throw switch being interposed between said second mixer and said third mixer, said second single pole, double throw switch having a first switch position and a second switch position; and a second pair of parallel signal paths being interposed between said first switch and said second switch;

wherein the first of said second pair of parallel signal paths is arranged so as to provide a straight signal path between said first switch and said second switch when said second switch is in its first switch position, so as to bypass said second mixer; and wherein the second of said second pair of parallel signal paths is arranged between said first switch and said second mixer, so as to provide a signal path through said second mixer when said second switch is in its second switch position;

whereby, when said first switch is in either of its first switch position and its second switch position, and said second switch is in its second switch position, said radar detector functions as a triple conversion radar detector, having down conversion at each of said first, second, and third mixers; and whereby, when said first switch is its second switch position and said second switch is in its first switch position, said radar detector functions as a dual conversion radar detector, having down conversion at each of said first and third mixers.

7. The broad band, multi-band radar detector of claim 6, in which the frequency $f_{2lo}$ of said second local oscillator frequency is higher than said frequency $f_l$ and is lower than said frequency $f_h$; and wherein said second of said second pair of parallel signal paths comprises a pair of filters in series, the first of said filters being a bandpass filter which encompasses said frequencies $f_l$, $f_{2lo}$ and $f_h$, and the second of said filters being a bandstop filter at the frequency $f_{2lo}$;

whereby, when said second switch is in its second position, a selected one of said frequencies $f_l$ and $f_h$ will be applied to the input port of said second mixer, and said frequency $f_{2lo}$ will be blocked from being fed back towards said first mixer.

8. The broad band, multi-band radar detector of claim 7, in which said second local oscillator is a synthesized frequency local oscillator whose output frequency is governed by a phase lock loop feedback circuit under the control of said microprocessor, and the output frequency $f_{2lo}$ of said second local oscillator is varied under the control of said microprocessor by an amount of plus or minus $f_{cal}$, and in which harmonic signals of frequencies $Nf_{2lo}$, where N is an integer, are present and radiated to and received at the signal input port of said first mixer;

wherein, for any desired input radar frequency, when present, there is a predetermined first intermediate frequency which is one of said frequencies $f_l$,$f_h$, and a third intermediate frequency which is the same frequency as the intermediate frequency which is output from said second mixer when said second switch is in its second position; and wherein said predetermined first intermediate frequency is a function of a specific predetermined output frequency of said swept frequency first local oscillator when mixed with said desired input radar frequency;

wherein the output frequency of said swept frequency first local oscillator is a function of the tuning voltage applied thereto, and wherein the relationship between the output frequency of said swept frequency first local oscillator and the tuning voltage applied thereto will vary over time and will vary with changes of temperature;

wherein said microprocessor controller includes memory means to store data relating to a plurality of tuning voltage values for a plurality of respective predetermined output frequencies of said swept frequency first local oscillator, and updating means to update any of said stored data under the control of said microprocessor;

wherein a harmonic frequency $Nf_{2lo}$ of the output frequency of said synthesized frequency second local oscillator is chosen from within the frequency range $N(f_{2lo} \pm f_{cal})$ by varying said output frequency of said synthesized frequency second local oscillator, so as to emulate reception of any desired input radar frequency when the correct respective specific predetermined output frequency of said swept frequency first local oscillator has been generated, in keeping with a calibration equation, as follows:

$$|Nf_{2lo} \pm f_{1lo}| = f_{sif}$$

where $f_{1lo}$ is the correct specific predetermined output frequency, and $f_{sif}$ is the predetermined first intermediate frequency; and wherein, at any instant in time, the output frequency of said swept frequency first local oscillator is swept under the control of said microprocessor until the frequency $f_{sif}$ is noted at the output port of said first mixer;

said radar detector further comprising means for updating the tuning voltage value in said memory means at that instant in time for said correct specific predetermined output frequency of said swept frequency first local oscillator;

whereby said radar detector is instantaneously calibrated to ensure that the presence of any desired input radar frequency will be detected by controlling the tuning voltage of said swept frequency first local oscillator.

9. The broad band, multi-band radar detector of claim 8, wherein said synthesized frequency second local oscillator is a push—push frequency doubler oscillator, whereby the output frequency $f_{2lo}$ is twice the fundamental frequency $f_{2lof}$ of oscillator within said synthesized frequency local oscillator;

whereby said calibration equation becomes:

$$\frac{|Nf_{2lo} \pm f_{1lo}|}{|2|} = f_{sif} \quad \text{or} \quad |Nf_{2lof} \pm f_{1lo}| = f_{sif}$$

10. The broad band, multi-band radar detector of claim 6, in which, when said first switch is in its second position and said second switch is in its first position, and when said first local oscillator is controlled by said microprocessor, a third intermediate frequency is output from the output port of said first mixer in the presence of selected radar frequencies of interest, where said third intermediate frequency is the same frequency as the intermediate frequency which is output from said second mixer when said second switch is in its second switch position.

11. The broad band, multi-band radar detector of claim 10, in which said first pair of parallel signal paths is preceded by a high pass filter which has a characteristic such as to pass said third intermediate frequency as well as said frequencies $f_l$ and $f_h$.

12. The broad band, multi-band radar detector of claim 11, in which a second intermediate frequency bandpass filter is interposed between said second switch and said third mixer, and said filter has a characteristic so as to pass the intermediate frequency output from said second mixer, and so as to pass said third intermediate frequency output from said first mixer when said first switch is in its second switch position and said second switch is in its first switch position.

13. A method of calibrating a broad band, multi-band radar detector for any desired input radar frequency, wherein said broad band, multi-band radar detector comprises a receiving antenna, a microprocessor controller having memory means to store data, a first mixer, a swept frequency first local oscillator under the control of said microprocessor, a second mixer, a synthesized frequency second local oscillator, a third mixer, a third local oscillator, signal processing circuits, and output means;

a first pair of parallel signal paths in series with a first single pole, double throw switch means being interposed between said first mixer and said second mixer, said first single pole, double throw switch means having a first switch position and a second switch position;

a second single pole, double throw switch being interposed between said second mixer and said third mixer, said second single pole, double throw switch having a first switch position and a second position; and a second pair of parallel signal paths being interposed between said first switch and said second switch;

wherein the output frequency of said synthesized frequency second local oscillator is governed by a phase lock feedback circuit under the control of said microprocessor, and the output frequency $f_{2lo}$ of said second local oscillator is varied under the control of said microprocessor by and amount of plus or minus $f_{cal}$, and in which harmonic signals of frequencies $Nf_{2lo}$, where N is and integer, are present; and wherein a harmonic frequency $Nf_{2lo}$ of the output frequency of said synthesized frequency second local oscillator is chosen from within the frequency range $N(f_{2lo} \pm f_{cal})$ by varying said output frequency of said synthesized frequency second local oscillator, so as to emulate reception of any desired input radar frequency when the correct respective specific predetermined output frequency of said swept frequency first local oscillator has been generated, in keeping with a calibration equation, as follows:

$$|Nf_{2lo} \pm f_{1lo}| = f_{sif}$$

where $f_{1lo}$ is the correct specific predetermined output frequency, and $f_{sif}$ is the predetermined first intermediate frequency;

said method comprising the steps of:

(a) controlling said first switch to its switch position, and controlling said second switch to its first switch position;

(b) establishing a specified output frequency $f_{2lo}$ of said second synthesized frequency local oscillator, and establishing the integral value for N, whereby the harmonic frequency $Nf_{2lo}$ will result in the output of intermediate frequency $f_{sif}$ from said first mixer when the output frequency $f_{1lo}$ reaches said specific predetermined output frequency for said desired input radar frequency;

(c) sweeping the frequency output of said swept frequency first local oscillator until said first mixer output intermediate frequency $f_{sif}$ is noted, and stopping the sweeping of said swept frequency local oscillator at that instant in time;

(d) noting the value of the tuning voltage driving said swept frequency first local oscillator at that instant in time; and (e) updating the respective tuning voltage value in said memory means;

whereby, until said radar detector is re-calibrated, it is accurately set for determining the presence of said desired input radar frequency by setting said swept frequency first local oscillator to the correct frequency by establishing the respective tuning voltage therefor in keeping with the value thereof stored in said memory means.

14. The method of claim 13, wherein a plurality of cycles of steps (a), (b), (c), (d), and (e) are taken for a plurality of desired input radar frequencies, and a corresponding plurality of tuning voltage data for said plurality of desired input radar frequencies are stored in said memory means;

whereby, at any time, it is possible to re-calibrate said radar detector for any selected plurality of said plurality of desired input radar frequencies.

15. The method of claim 14, wherein selected pairs of said plurality of desired input radar frequencies are chosen so as to establish the lower and upper limits of any selected radar frequency band of interest.

16. A method of calibrating a broad band, multi-band radar detector for any desired input radar frequency, wherein said broad band, multi-band radar detector comprises a receiving antenna, a microprocessor controller having memory means to store data, a first mixer, a swept frequency first local oscillator under the control of said microprocessor, a second mixer, a synthesized frequency second local oscillator, a third mixer, a third local oscillator, signal processing circuits, and output means;

a first pair of parallel signal paths in series with a first single pole, double throw switch means being interposed between said first mixer and said second mixer, said first single pole, double throw switch means having a first switch position and a second switch position;

a second single pole, double throw switch being interposed between said second mixer and said third mixer, said second single pole, double throw switch having a first switch position and a second switch position; and a second pair of parallel signal paths being interposed between said first switch and said second switch;

wherein the output frequency of said synthesized frequency second local oscillator is governed by a phase lock loop feedback circuit under the control of said microprocessor, and the output frequency $f_{2lo}$ of said second local oscillator is varied under the control of said microprocessor by an amount of plus or minus $f_{cal}$, and in which harmonic signals of frequencies $Nf_{2lo}$, where N is an integer, are present;

wherein a harmonic frequency $Nf_{2lo}$ of the output frequency of said synthesized frequency second local oscillator is chosen from within the frequency range $N(f_{2lo} \pm f_{cal})$ by varying said output frequency of said synthesized frequency second local oscillator, so as to emulate reception of any desired input radar frequency when the correct respective specific predetermined output frequency of said swept frequency first local oscillator has been generated, in keeping with a calibration equation, as follows:

$$|Nf_{2lo} \pm f_{1lo}| = f_{sif}$$

wherein $f_{1lo}$ is the correct specific predetermined output frequency, and $f_{sif}$ is the predetermined first intermediate frequency; and wherein said synthesized frequency second local oscillator is a push—push frequency doubler oscillator, whereby the output frequency $f_{2lo}$ is twice the fundamental frequency $f_{2lof}$ of oscillator within said synthesized frequency local oscillator;

whereby said calibration equation becomes:

$$\frac{|Nf_{2lo} \pm f_{1lo}|}{2} = f_{1lo} \text{ or } |Nf_{2lof} \pm f_{1lo}| = f_{sif}$$

said method comprising the steps of:
(a) controlling said first switch to its second switch position, and controlling said second switch to its first switch position;
(b) establishing a specified fundamental frequency of oscillation $f_{2lo}$ of said push—push oscillator, and establishing the integral value for N, whereby the harmonic frequency $Nf_{2lof}$ will result in the output of intermediate frequency $f_{sif}$ from said first mixer when the output frequency $f_{1lo}$ reaches said specific predetermined output frequency for said desired input radar frequency;
(c) sweeping the frequency output of said swept frequency first local oscillator until said first mixer output intermediate frequency $f_{sif}$ is noted, and stopping the sweeping of said swept frequency first local oscillator at that instant in time;
(d) noting the value of the tuning voltage driving said swept frequency first local oscillator at that instant in time; and
(e) updating the respective tuning voltage value in said memory means;
whereby, until said radar detector is re-calibrated, it is accurately set for determining the presence of said desired input radar frequency by setting said swept frequency first local oscillator to the correct frequency by establishing the respective tuning voltage therefor in keeping with the value thereof stored in said memory means.

17. The method of claim 16, wherein a plurality of cycles of steps (a), (b), (c), (d), and (e) are taken for a plurality of desired input radar frequencies, and a corresponding plurality of tuning voltage data for said plurality of desired input radar frequencies are stored in said memory means;
whereby, at any time, it is possible to re-calibrate said radar detector for any selected plurality of said plurality of desired input radar frequencies.

18. The method of claim 17, wherein selected pairs of said plurality of desired input radar frequencies are chosen so as to establish the lower and upper limits of any selected radar frequency band of interest.

19. A self-calibrating broad band, multi-band radar detector having at least a first mixer circuit and a second mixer circuit;

said first mixer circuit having a first mixer element which has a signal input port, a local oscillator input port, an intermediate frequency output port, and a first local oscillator whose output frequency $f_{1lof}$ is variable, said second mixer circuit having a second mixer element which has a signal input port, a local oscillator input port, an intermediate frequency output port, and a second local oscillator whose output frequency $f_{2lof}$ is variable;

in which one of said first and second local oscillators is a voltage tuned, swept frequency local oscillator, and the other of said first and second local oscillators is a synthesized frequency local oscillator whose output frequency is governed by a controllable phase lock loop feedback circuit;

the fundamental frequency or an harmonic thereof of either of said first and second mixer circuits being mixed with the fundamental frequency or an harmonic thereof of the other of said second and first mixer circuits so as to cause an intermediate frequency output from said other of said second and first mixer circuits;

wherein, when a predetermined input radar signal frequency is input to said input port of said first mixer element there will be a specific intermediate frequency output signal from the output port of said first mixer element when said first local oscillator frequency $f_{1lof}$ has a predetermined value;

wherein, when a predetermined input signal frequency is input to said input port of said second mixer, there will be a specific intermediate frequency output from the output port of said second mixer element when said second local oscillator frequency $f_{2lof}$ has a predetermined value; and wherein, for any predetermined radar input signal frequency which causes a specific intermediate frequency $f_{sif}$ output from one of said first mixer and said second mixer, there exists a calibration equation as follows:

$$|Nf_{1lof} \pm Mf_{2lof}| = f_{sif}$$

where N and M are each integers having a value of at least 1;

said radar detector further including microprocessor means to establish the integral values of N and M, to control the phase lock loop feedback circuit of said synthesized frequency local oscillator, to control the sweeping of the output frequency of said swept frequency local oscillator by adjusting the tuning voltage thereof, and to note the presence of a specified intermediate frequency signal at frequency $f_{sif}$ at the output port of the respective one of said first and second mixer elements; and memory means in which the tuning voltage which sets the respective output frequency of said swept frequency local oscillator for each respective predetermined input radar frequency is stored for later recall so as to re-set the tuning voltage of the swept frequency local oscillator to any respective value for any respective input radar frequency to said radar detector;

whereby said radar detector is calibrated for any predetermined radar input signal frequency by establishing the integral values of N and M, controlling the phase lock loop feedback circuit of said synthesized frequency local oscillator so as to set the output frequency thereof to the respective one of said output frequencies $f_{2lof}$ and $f_{1lof}$, sweeping the output frequency of said swept frequency local oscillator by adjusting the tuning voltage thereof until a specified intermediate frequency signal at frequency $f_{sif}$ is noted at the output port of the respective one of said first and second mixer elements, at which time the respective one of said output frequencies $f_{1lof}$ and $f_{2lof}$ has been reached so as to satisfy said calibration equation, and noting the tuning voltage for said respective output frequency.

20. The self-calibrating broad band, multi-band radar detector of claim 19, in which said first local oscillator is a voltage tuned swept frequency local oscillator, and said second local oscillator is a push—push synthesized frequency local oscillator.

21. The self-calibrating broad band, multi-band radar detector of claim 19, in which said swept frequency local oscillator is a voltage tuned, push—push local oscillator.

* * * * *